US012738331B2

(12) United States Patent
Ke et al.

(10) Patent No.: US 12,738,331 B2
(45) Date of Patent: Sep. 15, 2026

(54) PROGRAMMING METHODS OF MEMORY, MEMORIES, AND MEMORY SYSTEMS

(71) Applicant: Yangtze Memory Technologies Co., Ltd., Hubei (CN)

(72) Inventors: Ke Ke, Wuhan (CN); Li Xiang, Wuhan (CN); Xufeng Zhou, Wuhan (CN); Zhipeng Dong, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 116 days.

(21) Appl. No.: 18/936,840

(22) Filed: Nov. 4, 2024

(65) Prior Publication Data

US 2026/0031159 A1 Jan. 29, 2026

(30) Foreign Application Priority Data

Jul. 29, 2024 (CN) ........................ 202411027511.2

(51) Int. Cl.
*G11C 16/34* (2006.01)
*G11C 16/04* (2006.01)
*G11C 16/10* (2006.01)

(52) U.S. Cl.
CPC ...... *G11C 16/3427* (2013.01); *G11C 16/0483* (2013.01); *G11C 16/10* (2013.01)

(58) Field of Classification Search
CPC . G11C 16/3427; G11C 16/0483; G11C 16/10; G11C 16/0466; G11C 16/32; G11C 16/08; G11C 16/3459
USPC ........................................ 365/185.02, 185.24
See application file for complete search history.

(56) References Cited

U.S. PATENT DOCUMENTS

| | | | | |
|---|---|---|---|---|
| 6,584,034 B1 * | 6/2003 | Hsu | G11C 8/12 | 365/189.04 |
| 8,154,902 B2 * | 4/2012 | Sutardja | G11C 16/24 | 365/104 |
| 11,361,824 B1 * | 6/2022 | Ku | G11C 16/14 | |
| 11,361,835 B1 * | 6/2022 | Lien | G11C 16/3459 | |
| 11,875,043 B1 * | 1/2024 | Zainuddin | G06F 3/0625 | |
| 2002/0048210 A1 * | 4/2002 | Tomotani | G11C 8/12 | 365/230.03 |
| 2008/0098164 A1 * | 4/2008 | Lee | G06F 12/0866 | 711/E12.019 |
| 2014/0050039 A1 * | 2/2014 | Park | G11C 11/4091 | 365/230.03 |
| 2019/0066793 A1 * | 2/2019 | Shin | G11C 16/08 | |
| 2020/0168280 A1 * | 5/2020 | Seo | G11C 16/3427 | |

(Continued)

*Primary Examiner* — Michael T Tran
(74) *Attorney, Agent, or Firm* — Hanley, Flight & Zimmerman, LLC

(57) ABSTRACT

The present disclosure provides a programming method of a memory, a memory, and a memory system, and relates to the technical field of semiconductor chips. The method includes: applying a first program voltage to a first type of selected word lines and a reference voltage to unselected word lines adjacent to the first type of selected word lines during a first time period of a first program stage; and applying a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage.

18 Claims, 15 Drawing Sheets

(56) References Cited

U.S. PATENT DOCUMENTS

2021/0327511 A1* 10/2021 Liu .................... G11C 11/5628
2021/0375367 A1* 12/2021 Senoo .................... G11C 16/24
2021/0382511 A1* 12/2021 Kim .................... H02M 3/158
2022/0068388 A1* 3/2022 Shin .................... G11C 16/0483
2022/0122678 A1* 4/2022 Kim .................... G11C 16/10
2022/0130474 A1* 4/2022 Choi .................... G11C 16/10
2022/0254419 A1* 8/2022 Kim .................... G11C 16/30
2023/0229344 A1* 7/2023 Choi .................... G06F 3/0655
711/154
2023/0317168 A1* 10/2023 Park .................... G11C 16/0425
365/185.18
2023/0326531 A1* 10/2023 Wang .................... G11C 16/0483
365/185.17
2023/0367488 A1* 11/2023 Du .................... G11C 16/10
2023/0377657 A1* 11/2023 Yang .................... G11C 16/26
2023/0393759 A1* 12/2023 Jeong .................... G11C 29/50004
2023/0402120 A1* 12/2023 Lee .................... G11C 29/025

* cited by examiner

PROGRAMMING METHODS OF MEMORY, MEMORIES, AND MEMORY SYSTEMS

CROSS-REFERENCE TO RELATED APPLICATIONS

This application claims priority to and the benefit of Chinese Patent Application 202411027511.2, filed on Jul. 29, 2024, which is hereby incorporated by reference in its entirety.

TECHNICAL FIELD

The present disclosure relates to the technical field of semiconductor chips, and particularly to a programming methods of a memory, memories, and memory systems.

BACKGROUND

Currently, when programming memory cells, the program approach used is sequential programming.

DETAILED DESCRIPTION

Figure 1:
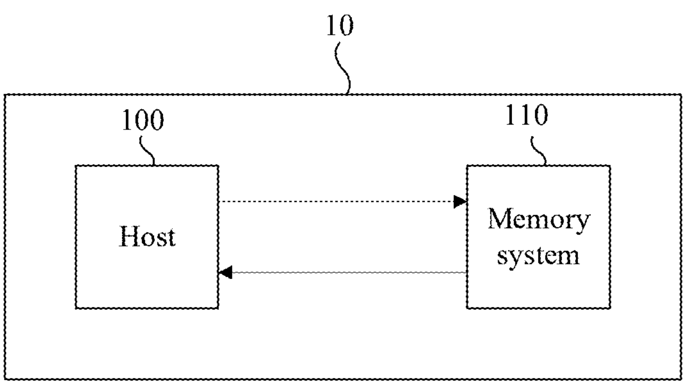
FIG. 1 is a block diagram of an electronic apparatus provided by examples of the present disclosure.

The technical solutions in some examples of the present disclosure will be described below clearly and completely in conjunction with the drawings. Apparently, the examples described are only part of, but not all of, the examples of the present disclosure. All other examples obtained by those of ordinary skills in the art based on the examples provided by the present disclosure shall fall in the scope of protection of the present disclosure.

Unless otherwise specified in the context, throughout the specification and the claims, the term “comprise” is interpreted as an open and inclusive meaning, e.g., “including, but not limited to”. In the description of the specification, the terms “one example”, “some examples”, “exemplary example”, “exemplarily”, or “some examples” etc. are intended to indicate that particular features, structures, materials, or characteristics related to the example or example are included in at least one example or example of the present disclosure. The schematic representation of the above terms may not necessarily refer to the same example or example. Furthermore, these particular features, structures, materials, or characteristics may be included in one or more examples or examples in any suitable manner.

In the following, the terms “first” and “second” are only for the purpose of description, and cannot be construed as indicating or implying relative importance or implicitly indicating the number of indicated technical features. Thus, features defined by “first” and “second” may explicitly or implicitly comprise one or more of such features. In the description of the examples of the present disclosure, “a plurality of” means two or more, unless otherwise stated.

In describing some examples, expressions of “coupled” and derivatives thereof may be used. For example, the term “coupled” may be used in the description of some examples to indicate that two or more components have a direct physical contact or an electrical contact. In this case, “coupled” may be also described as “connected”. Furthermore, the term “coupled” may also mean that two or more components have no direct contact with each other, but still collaborate or interact with each other. The examples disclosed herein are not necessarily limited to the content herein.

“At least one of A, B and C” and “at least one of A, B or C” have the same meaning, both including the following combinations of A, B and C: A alone, B alone, C alone, a combination of A and B, a combination of A and C, a combination of B and C, and a combination of A, B and C.

“A and/or B” includes the following three combinations: A alone, B alone, and a combination of A and B. The use of “suitable for” or “configured to” herein means open and inclusive language, and does not exclude an apparatus suitable for performing or configured to perform additional tasks or steps. In addition, the use of “based on” means open and inclusive, as processes, steps, calculations, or other actions “based on” one or more conditions or values may be based on an additional condition or exceeded value in practice.

The use of “configured to” herein means open and inclusive language, and does not exclude an apparatus suitable for performing or configured to perform additional tasks or steps.

Using the sequential programming to program memory cells coupled to word lines will lead to a coupling effect between the word lines, thereby affecting the program process of the memory cells. Examples of the present disclosure provide an electronic apparatus that may be, for example, any one of a cellphone, a desktop computer, a tablet computer, a notebook computer, a server, a vehicle apparatus, a wearable apparatus (e.g., a smart watch, a smart bracelet, smart glasses, etc.), a power bank, a gaming machine, a digital multimedia player, etc. Referring to FIG. 1, FIG. 1 shows a block diagram of an electronic apparatus 10 provided by examples of the present disclosure. The electronic apparatus 10 comprises a host 100 and a memory system 110. The host 100 is coupled with the memory system 110 to write data to the memory system 110 or read data stored in the memory system 110. The host is also called a master apparatus, and the memory system is also called a slave apparatus. In the electronic apparatus, the slave apparatus is accessible by different master apparatuses. For example, taking the electronic apparatus being a cellphone as an example, a central processing unit (CPU), a digital signal processor (DSP) and the like of the cellphone can access the memory system as hosts.

Figure 2:
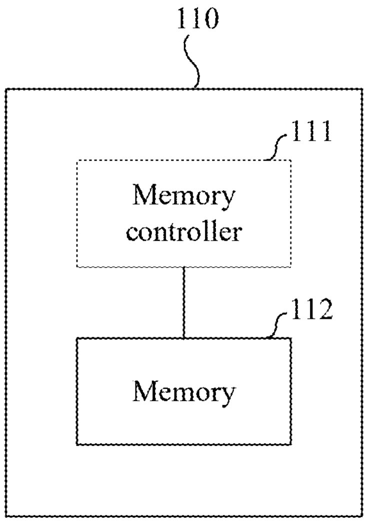
FIG. 2 is a block diagram of a memory system provided by examples of the present disclosure.

In an example, referring to FIG. 2, FIG. 2 shows a block diagram of the memory system 110 provided by examples of the present disclosure. The memory system 110 comprises a memory controller 111 and a memory 112, wherein the memory controller 111 is coupled to the memory 112 to control the memory 112 to store data. The memory 112 may be a 2-dimensional (2D) memory or a 3-dimensional (3D) memory.

The memory system 110 may be integrated into various types of storage apparatuses, for example, be included in the same package (e.g., a Universal Flash Storage (UFS) package or an Embedded Multi Media Card (eMMC) package). That is, the memory system 110 may be applied to and packaged into different types of electronic products, for example, a mobile phone (e.g. a cellphone), a desktop computer, a tablet computer, a notebook computer, a server, a vehicle apparatus, a gaming console, a printer, a positioning apparatus, a wearable apparatus, a smart sensor, a power bank, a Virtual Reality (VR) apparatus, an Augmented Reality (AR) apparatus, or any other suitable electronic apparatuses having memories therein.

In some examples, the memory system 110 comprises a memory controller 111 and one memory 112, and may be integrated into a memory card. The memory card includes any one of a Personal Computer Memory Card International Association (PCMCIA) card (a PC card), a Compact Flash (CF) card, a Smart Media (SM) card, a memory stick, a Multi Media Card (MMC), a Secure Digital (SD) memory card and a UFS.

Figure 3:
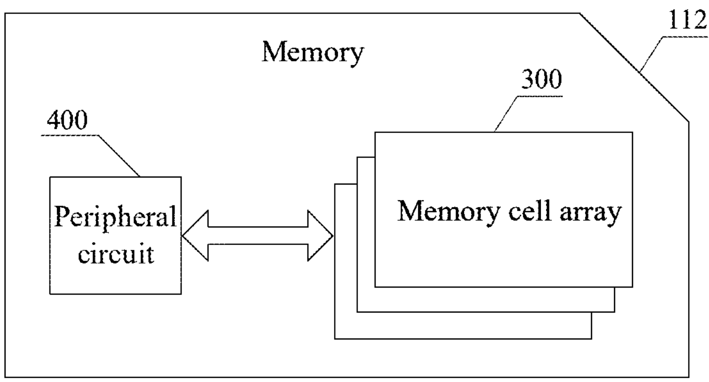
FIG. 3 is a block diagram of a storage apparatus provided by examples of the present disclosure.

In some examples, referring to FIG. 3, the memory 112 comprises a memory cell array 300 and a peripheral circuit 400 coupled to the memory cell array 300. The memory cell array 300 may adopt a NAND architecture or a NOR architecture.

Figure 4:
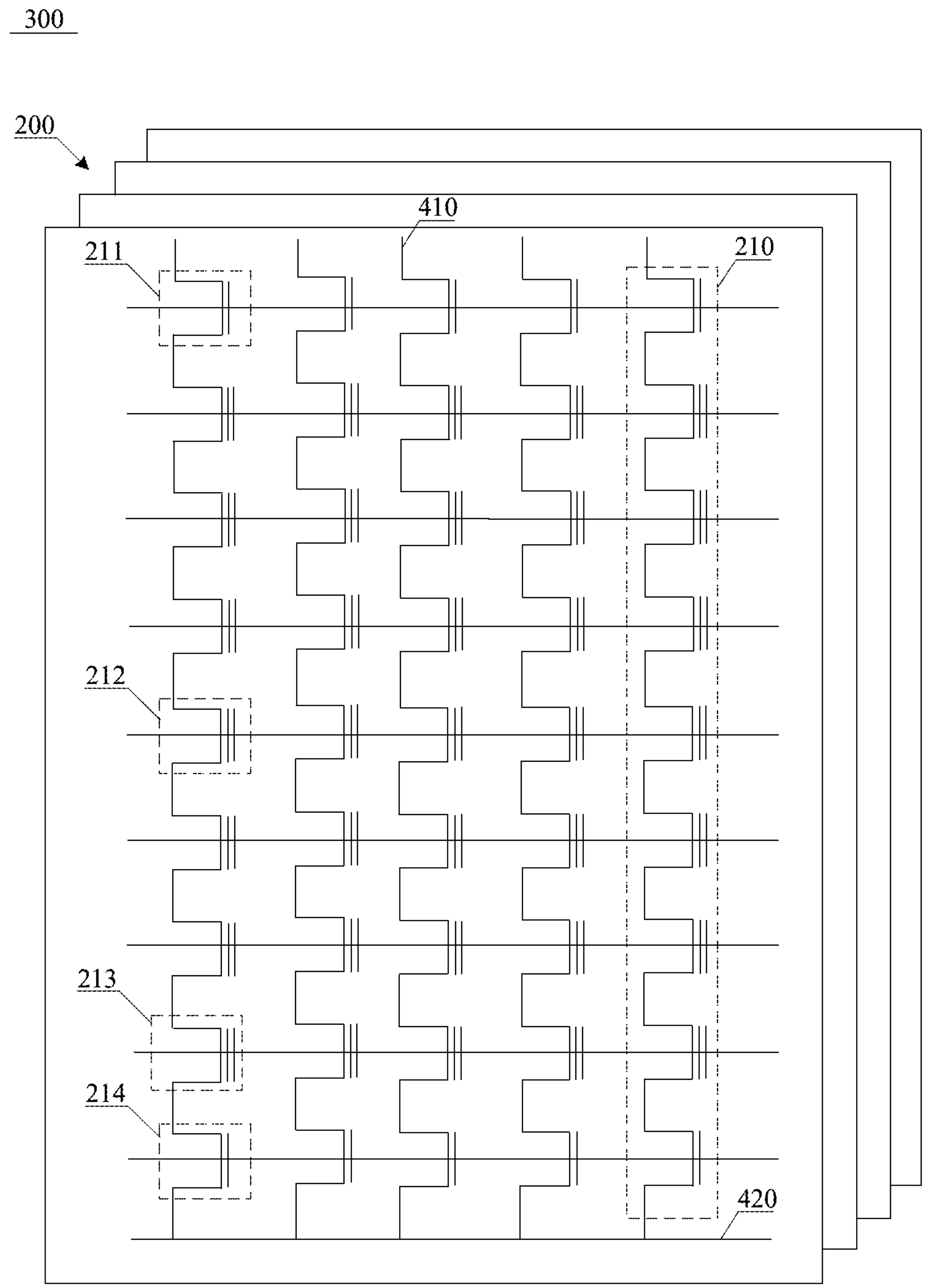
FIG. 4 is a block diagram of a memory cell array provided by examples of the present disclosure.

As shown in FIG. 4, in some implementations, the memory cell array 300 may comprise a memory block 200 that may comprise a plurality of memory strings 210, wherein each memory string 210 may comprise a top select gate (TSG) 211, a plurality of memory cells 212, a dummy memory cell 213, and a bottom select gate (BST) 214 that are stacked in parallel sequentially. One end of the memory string 210 is coupled with a bit line (BL) 410, and the other end of the memory string 210 is coupled with a source line (SL) 420.

The memory cell comprises a floating gate field effect transistor or a charge trapping transistor, etc. The examples of the present disclosure are introduced by taking the charge trapping transistor as an example.

Figure 5:
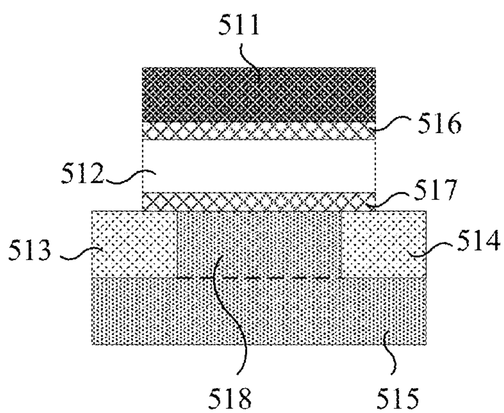
FIG. 5 is a schematic structural diagram of a charge trapping transistor provided by examples of the present disclosure.

Referring to FIG. 5, FIG. 5 shows a schematic structural diagram of a charge trapping transistor that comprises a control gate 511, a charge trapping layer 512, a source 513, a drain 514, a substrate 515, an oxide layer 516 and a tunnel oxide layer 517. The source 513 and the drain 514 are disposed on the substrate 515. The examples of the present disclosure take a charge trapping layer field effect transistor with an N channel as an example. The substrate 515 comprises a P type semiconductor material, while the source 513 and the drain 514 comprise an N type semiconductor material. A substrate material between the source 513 and the drain 514 may form a conductive channel 518. The charge trapping layer 512 covers the conductive channel 518. The tunnel oxide layer 517 is located between the charge trapping layer 512 and the conductive channel 518 to separate the charge trapping layer 512 from the source 513, the drain 514 and the conductive channel 518. The control gate 511 is disposed on the charge trapping layer 512, and the oxide layer 516 is disposed between the control gate 511 and the charge trapping layer 512 to separate the control gate 511 from the charge trapping layer 512. The oxide layer 516 and the tunnel oxide layer 517 are both made of an insulation material, e.g., silicon dioxide ($SiO_2$).

The charge trapping layer 212 is made of an insulation material of a high charge trapping density. During data writing, the charge trapping layer 212 traps electrons, a threshold voltage of the field effect transistor will change, and the data is stored with such characteristic. During data erasing, holes in the channel are injected into the charge trapping layer 212 to neutralize the electrons in the charge trapping layer 212, thereby achieving erasing.

When the charge trapping layer traps the electrons, due to a shielding effect of the electrons, there is a need for a higher threshold voltage in order to turn on the conductive channel. If a threshold voltage is recorded as Vth1 in the case where there is no trapped electron in the charge trapping layer, and a threshold voltage is recorded as Vth2 in the case where there are electrons trapped in the charge trapping layer, then it is assumed to try to turn on the charge trapping transistor using a voltage greater than Vth1 but less than Vth2. If the charge trapping transistor is turned on, then it may be determined that no electrons are trapped in the charge trapping layer. If the charge trapping transistor is not turned on, then it may be determined that electrons are trapped in the charge trapping layer. Based on such logic, in the case where there is no electron trapped on the charge trapping layer, the charge trapping transistor is in an on state, representing 1. In the case where the electrons are trapped on the charge trapping layer, the charge trapping transistor is in an off state, representing 0. Therefore, such different states may be utilized to store data. The threshold voltage of the charge trapping transistor is changed by injecting or trapping the electrons at the charge trapping layer to achieve a storage function.

Figure 6:
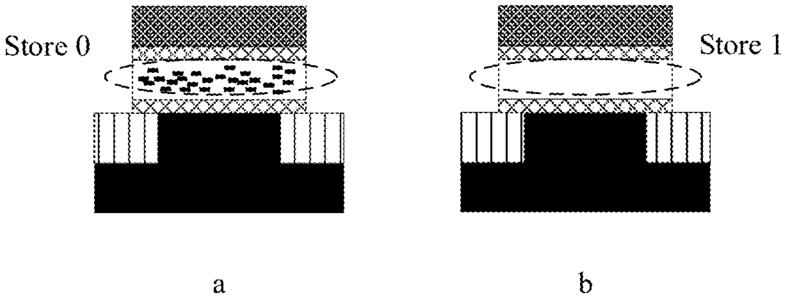
FIG. 6 is a schematic diagram of a charge trapping transistor storing data provided by examples of the present disclosure.

A voltage is applied at the control gate, and a tunneling effect occurs based on a potential difference between the control gate and the channel, such that the electrons may be injected in the charge trapping layer, or trapped by the charge trapping layer. During data storage, the data is stored in the charge trapping layer, and the presence or absence of charge in the charge trapping layer may be used to indicate the data currently stored in the memory cells. For example, referring to FIG. 6, as shown in a of FIG. 6, a charged state of the charge trapping layer stores 0, and as shown in b of FIG. 6, an uncharged state of the charge trapping layer stores 1. The process of storing data in the memory cell is the process of programming the memory cell.

Figure 7:
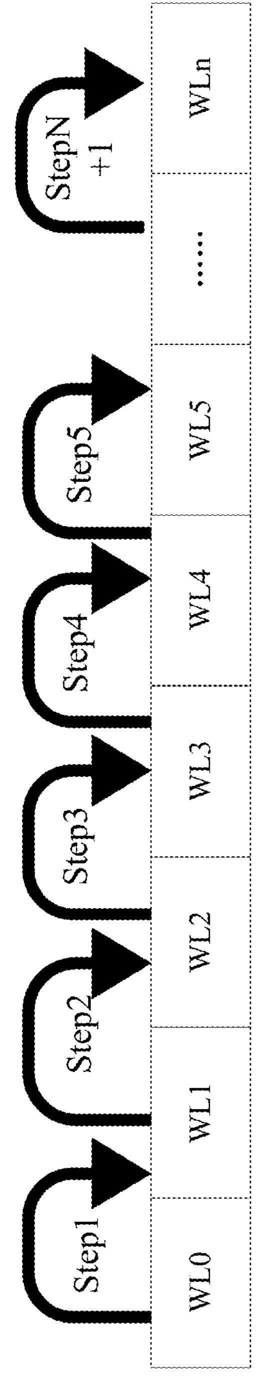
FIG. 7 is a schematic diagram of a program sequence of a programming method provided by examples of the present disclosure.

In some implementations, during programming of the memory cell, referring to FIG. 7, the program approach used is sequential programming. Specifically, the method firstly programs a memory cell coupled to a word line (WL)0 (Step1), then programs a memory cell coupled to WL1 (Step2), and so on, and finally programs a memory cell coupled to WLn (StepN+1). Such approach of sequential programming ensures that each memory cell is programmed according to the sequence of the word line in which it is located, thereby realizing systematic programming of the entire memory cell array. Through the stepwise and sequential programming, the charge distribution and programming accuracy in the program process can be effectively managed, ensuring that each memory cell can stably store the required information.

However, using the approach of sequential programming to program the memory cells coupled to the word lines will lead to a coupling effect between the word lines, thereby affecting the program process of the memory cells. Specifically, the coupling effect means that the charge state of one word line affects the charge state of the adjacent word line, thereby interfering with the program process. Taking the memory cell coupled to WL1 as an example, the memory cell coupled to WL0 adjacent to WL1 has been programmed and entered the programmed state, while another memory cell coupled to WL2 adjacent to WL1 has not been programmed and is still in the erased state. A significant difference in charge state between WL0 in the programmed state and WL2 in the erased state will cause a larger coupling effect, resulting in the migration of the charge from the word line in the programmed state to the word line in the erased state. Such charge migration will significantly interfere with the programming of the memory cell of the middle WL1, affecting the accuracy and efficiency of its program process.

The particular performance of the coupling effect can be shown as follows: first, after finishing the programming of WL1, WL1 is read to obtain a read voltage $V_{read1}$, and then after finishing the programming of WL2, WL1 is read again to obtain a read voltage $V_{read2}$, the voltage distribution of which becomes wider compared to $V_{read1}$.

Figure 8:
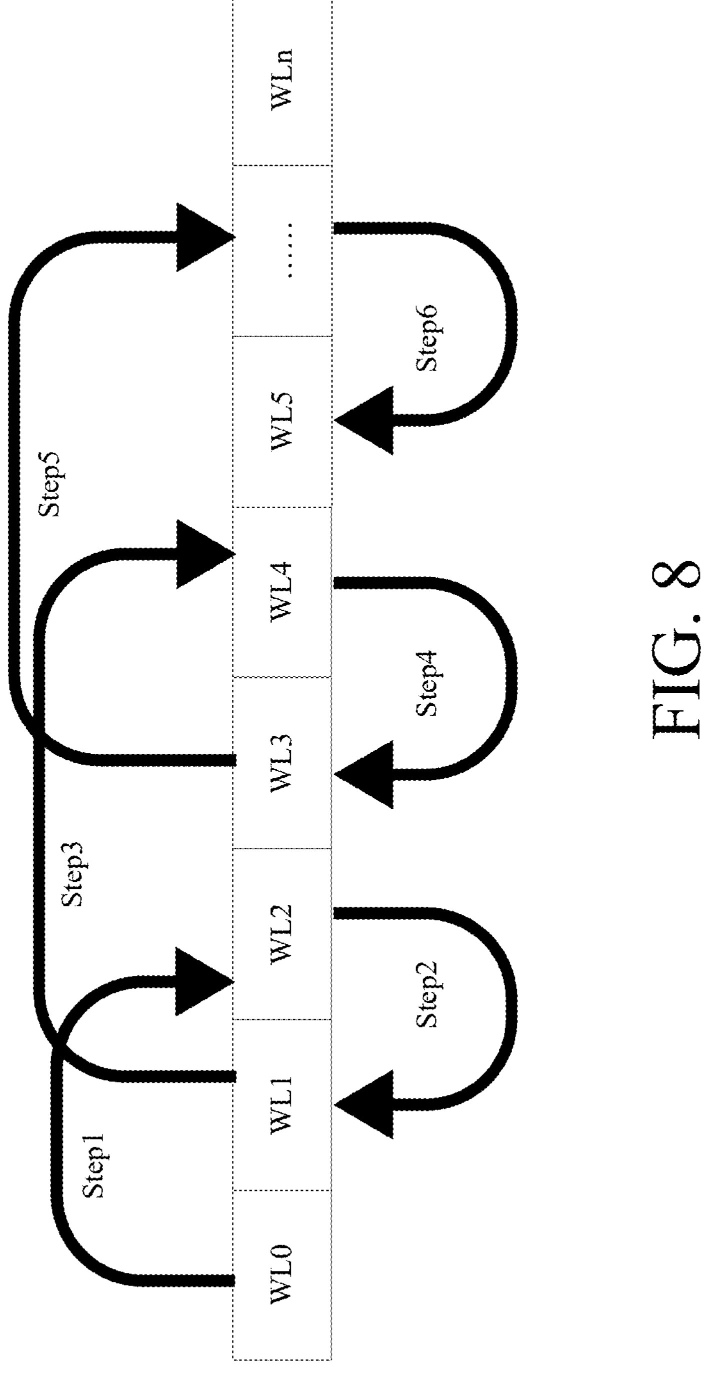
FIG. 8 is a schematic diagram of another program sequence of a programming method provided by examples of the present disclosure.

The examples of the present disclosure provide a programming scheme to reduce the coupling effect between word lines. Referring to FIG. 8, the memory cells coupled to WL0 are first programmed, the memory cells coupled to WL2 are then programmed (Step1), and the memory cells coupled to WL1 are then programmed (Step2). The memory cells coupled to WL4 are then programmed (Step3), the memory cells coupled to WL3 are then programmed (Step4), . . . , and the memory cells coupled to WLn are finally programmed.

As can be seen, during the programming of the memory cells, all of the word lines can be divided into two types according to the storage state of memory cells coupled to adjacent word lines. The first type may comprise even-numbered word lines, and the second type may comprise odd-numbered word lines. The memory cells coupled to the word lines adjacent to an odd-numbered word line are all in the programmed state, and the memory cells coupled to the word lines adjacent to an even-numbered word line are all in the erased state.

For an odd-numbered word line, in an example, for WLn, the memory cells coupled to WLn−1 adjacent to WLn have been programmed and are in the programmed state, while the memory cells coupled to WLn+1 adjacent to WLn have also been programmed and are in the programmed state. That is, the memory cells coupled to WLn−1 and WLn+1 adjacent to WLn are both in the programmed state, effectively reducing the coupling effect between the word lines adjacent to WLn.

For an even-numbered word line, in an example, for WLn, the memory cells coupled to WLn−1 adjacent to WLn have not been programmed and are in the erased state, while the memory cells coupled to WLn+1 adjacent to WLn have not been programmed either and are in the erased state. That is, the memory cells coupled to WLn−1 and WLn+1 adjacent to WLn are both in the erased state, and there is still a coupling effect between the word lines adjacent to WLn.

Figure 9:
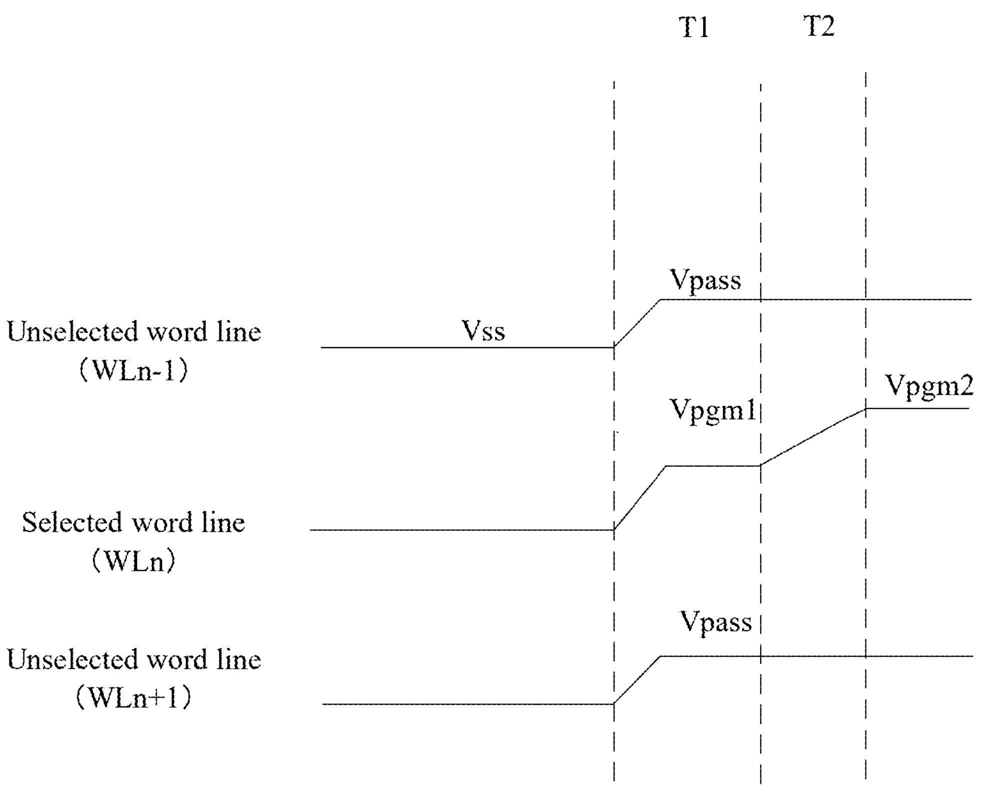
FIG. 9 is a schematic diagram of a program timing provided by examples of the present disclosure.

However, during the program stage, the program scheme shown in FIG. 9 is employed for both the even-numbered word lines and the odd-numbered word lines. In a first operation period (T1), the voltage of the selected word line is raised to Vpgm1, while Vpass is applied to the unselected word lines. That is, Vpass is applied to the unselected word lines in the time period T1. In a second operation period (T2), the voltage of the selected word line is raised from Vpgm1 to Vpgm2. However, because Vpgm2 is higher, it takes a longer time to raise the voltage from Vpgm1 to Vpgm2, and the entire time period T2 is also longer, resulting in a longer overall program time.

In order to solve one or more of the above problems, the examples of the present disclosure provide a scheme: adjusting the program process of the memory cells coupled to the even-numbered word lines (the memory cells coupled to the adjacent word lines are all in erased state), and reducing the required program time of the memory cells coupled to the even-numbered word lines, thereby improving the program time of the memory.

Figure 10:
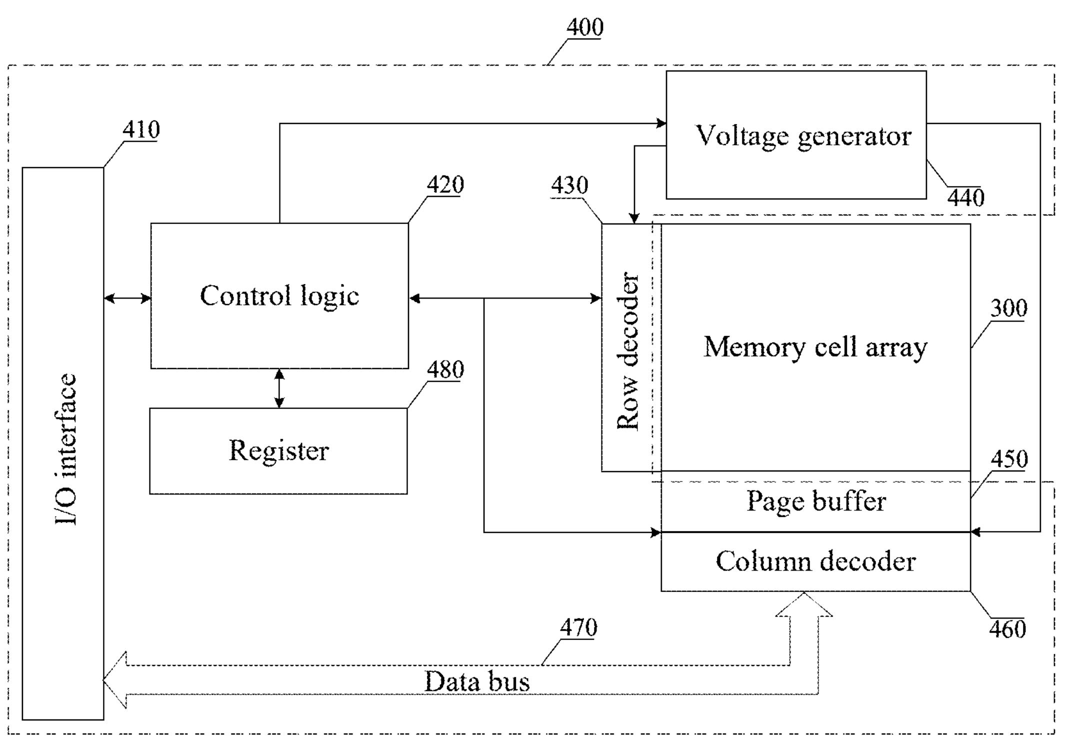
FIG. 10 is a schematic circuit connection diagram of a storage apparatus provided by examples of the present disclosure.

In some examples, FIG. 10 shows a schematic structural diagram of a memory cell array 300 and a peripheral circuit 400. In FIG. 10, the peripheral circuit 400 comprises an I/O interface 410, a control logic 420, a row decoder 430, a voltage generator 440, a page buffer 450, a column decoder 460, a data bus 470 and a register 480. It is to be understood that in some examples, additional circuits not shown in FIG. 10 may be included as well.

The I/O interface 410 may be coupled to the control logic 420, and act as a control buffer to buffer and relay control commands received from a memory controller (e.g., the memory controller 111 in FIG. 2) to the control logic 420 and state information received from the control logic 420 to a host. The I/O interface 410 may be also coupled to the page buffer 450 via the data bus 470 and act as a data I/O interface 410 and a data buffer to buffer and relay the data to and from the memory cell array 300.

The control logic 420 may be coupled to the voltage generator 440, the page buffer 450, the column decoder 460, the row decoder 430 and the I/O interface 410, etc., and configured to control operations of various peripheral circuits. The control logic 420 may generate an operation signal to control operations of the row decoder 430, the column decoder 460, the page buffer 450 and the voltage generator 440 in response to a command (CMD) or a control signal from the memory controller 111, wherein the command may be a program command, read command, etc.

The row decoder 430 may supply a word line voltage generated by the voltage generator 440 to a selected word line and an unselected word line of the memory cell array 300 in response to control of the control logic 420. As described in detail below, the row decoder 430 is configured to perform program operation on memory cells coupled to one or more selected word lines of the memory cell array 300.

The voltage generator 440 may use an external supply voltage or an internal supply voltage to generate various voltages for performing erase, program, read and verify operations on the memory cell array 300.

The column decoder 460 may select one or more memory cell strings 410 in the memory cell array 300 in response to control of the control logic 420 and by applying a bit line voltage generated from the voltage generator 440.

The page buffer 450 may read and program (write) data from and to the memory cell array 300 according to control signals from the control logic 420. In one example, the page buffer 450 may store program data (write data) to be programmed into the memory cell array 300. In another example, the page buffer 450 may perform a program verification operation to ensure that the data has been properly programmed into the memory cells coupled to the selected word lines. In yet another example, the page buffer 450 may also detect a low power signal from the bit lines that represents a data bit stored in the memory cells, and amplify a small voltage swing to a recognizable logic level in the read operation.

The register 480 may be coupled to the control logic 420 and include a state register, a command register, and an address register for storing state information, command operation codes (OP codes), and command addresses for controlling the operations of each peripheral circuit.

It is to be understood by those skilled in the art that operations performed by the row decoder 430, the page buffer 450, the control logic 420, and the voltage generator 440 described in the present disclosure may be performed by a processing circuit. The processing circuit may include, but is not limited to, hardware of a logic circuit or a hardware/software combination of a processor executing software.

Figure 11:
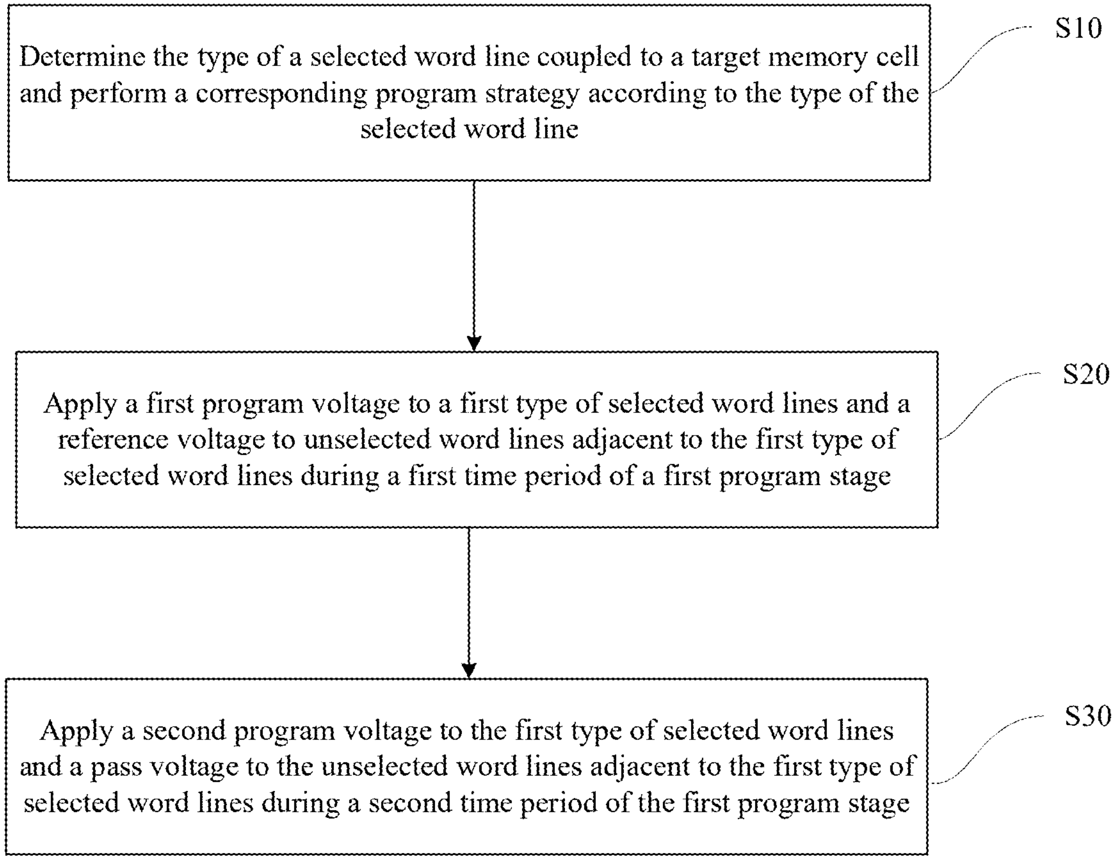
FIG. 11 is a schematic flow diagram of a programming method provided by examples of the present disclosure.

Specifically, when the above-mentioned peripheral circuit 400 works, an operation method as shown in FIG. 11 is performed and comprises S10-S30. At least one of S10, S20 or S30 may be performed.

Referring to FIG. 11, a programming method of a memory provided by the examples of the present disclosure comprises:

S10: determining the type of a selected word line coupled to a target memory cell, and performing a corresponding program strategy according to the type of the selected word line.

In order to optimize the programming process and improve the performance and reliability of the memory, before programming the memory cells, it is necessary to determine the type to which the currently selected word line belongs and select the best program strategy according to the type to which the selected word line belongs, thereby ensuring the reliability and timeliness of the program process. The type of the selected word line may include a first type of selected word lines and a second type of selected word lines. The first type of selected word lines may be word lines in which the memory cells coupled to the adjacent unselected word lines are in an erased state, and the second type of selected word lines may be word lines in which the memory cells coupled to the adjacent unselected word lines are in a programmed state. For two different types of selected word lines, different program voltages and time parameters can be used to improve the program speed.

Figure 12:
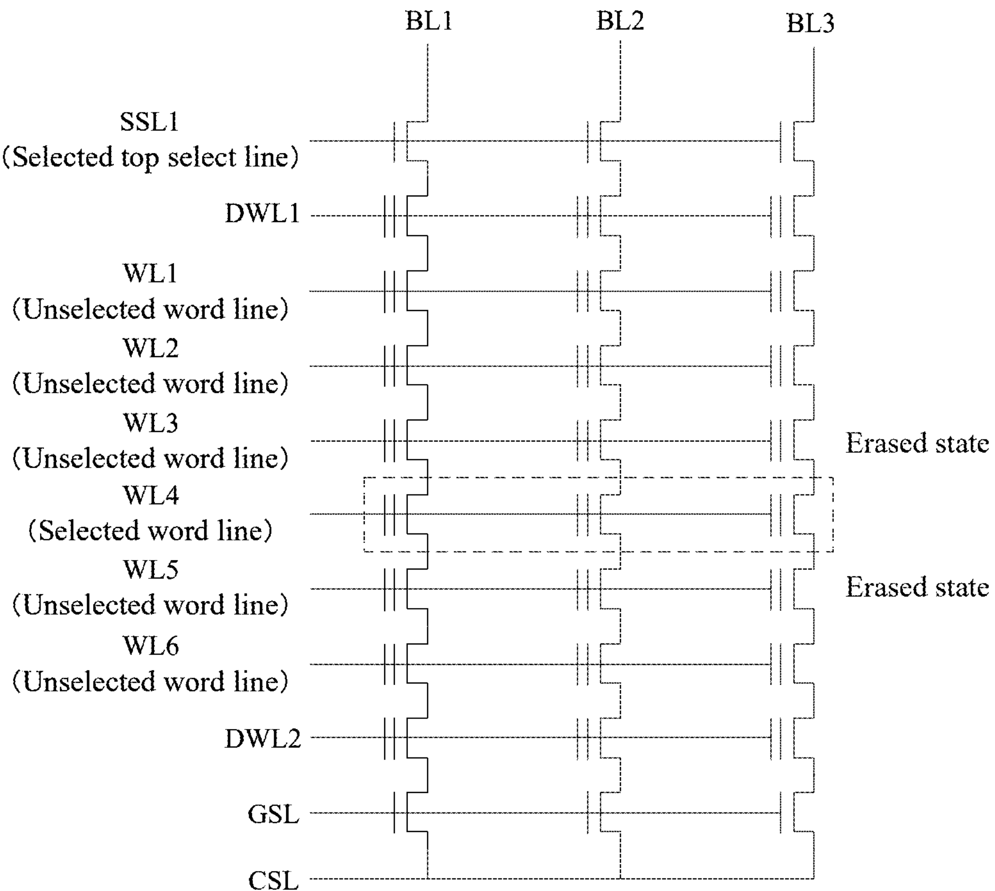
FIG. 12 is a schematic diagram of a word line state provided by examples of the present disclosure.
Figure 13:
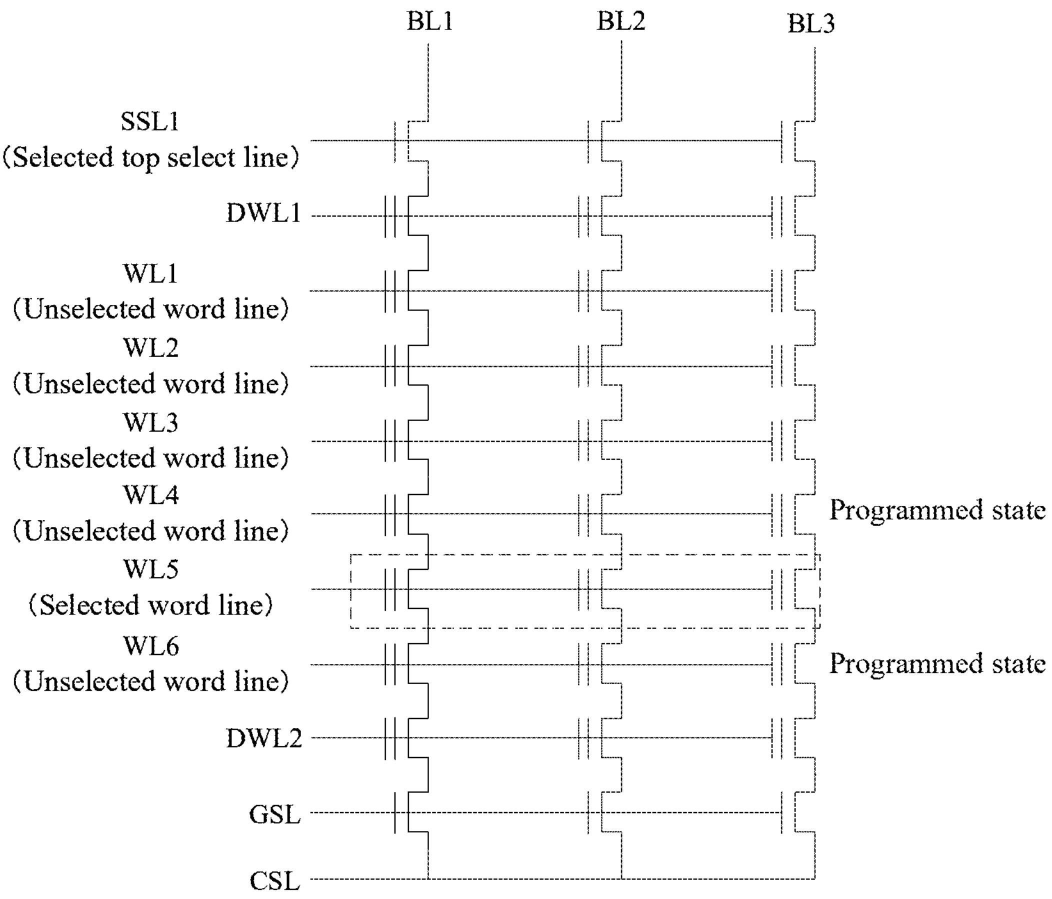
FIG. 13 is a schematic diagram of another word line state provided by examples of the present disclosure.

In an example, referring to FIG. 12, the selected word line is WL4, and the memory cells coupled to the unselected word lines WL3 and WL5 adjacent to WLA are in the erased state, so that the selected word line WL4 may be the first type of selected word line. With continued reference to FIG. 13, the selected word line is WL5, and the memory cells coupled to the unselected word lines WL4 and WL6 adjacent to WL5 are in the erased state, so that the selected word line WL5 may be the second type of selected word line.

In a feasible implementation, determining the type of the selected word line coupled to the target memory cell may be implemented by the following operations:

S101: acquiring a word line address of the selected word line, and determining the type of the selected word line coupled to the target memory cell according to a matching result between the word line address and a preset grouping relationship table.

In order to effectively manage and distinguish different types of word lines, a grouping relationship table may be built according to the preset program sequence and may contain different types of word line grouping information and corresponding word line address information. Each record may include one word line address and a grouping type to which this word line belongs (such as the first type of selected word lines or the second type of selected word lines). When some memory cell needs to be programmed, the specific address of the word line connected to the target memory cell is first acquired through an input address signal, and then, the grouping relationship table is traversed based on the word line address to find the record corresponding to this word line address. Through the matching, it is determined whether the selected word line coupled to the target memory cell belongs to the first type of selected word line or the second type of selected word line.

It is to be noted that the process of determining the type of the selected word line coupled to the target memory cell may be implemented by a memory or a memory controller, which is not limited by the present disclosure.

In an example, the grouping relationship table may be as shown in Table 1. When programming the memory cell coupled to WL4, the input address signal is 0x02, and the grouping relationship table is traversed based on the word line address 0x02 to find a respective record. Through the searching, it is determined that the type corresponding to WL4 is the second type of selected word line.

TABLE 1

| Word line address | Type |
|---|---|
| 0x01 | First type of selected word line |
| 0x02 | Second type of selected word line |
| 0x03 | First type of selected word line |
| 0x04 | Second type of selected word line |
| . . . | . . . |

After determining the type of the selected word line, when the memory cells coupled to the first type of selected word lines and the second type of selected word lines are programmed, the program process may be divided into two program stages, and different operations are performed in different program stages, which will be described below with the first type of selected word lines.

S20: applying a first program voltage to the first type of selected word lines and a reference voltage to unselected word lines adjacent to the first type of selected word lines during a first time period of a first program stage.

During the first time period of the first program stage, the main object is to raise the first type of selected word lines to the first program voltage and enable the entire program operation to be carried out smoothly. By raising the first type of selected word lines to the first program voltage, the memory cells coupled to the first type of selected word lines may be initially activated, making the memory cells ready to accept program pulses. Meanwhile, during the first period of the first program stage, it is also necessary to ensure that the adjacent unselected word lines are kept at a stable voltage level to avoid unnecessary interference to the memory cells on the unselected word lines.

Figure 14:
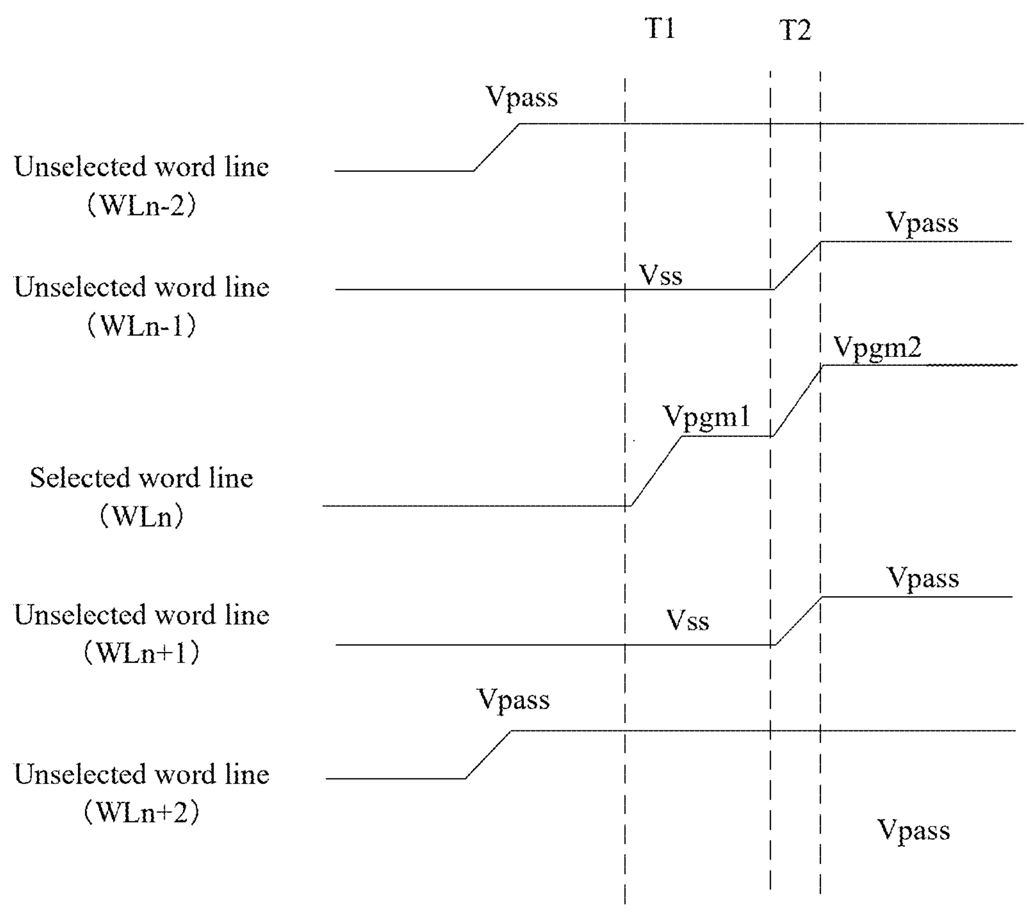
FIG. 14 is a schematic diagram of another program timing provided by examples of the present disclosure.

As an example, referring to FIG. 14, during the first time period of the first program stage, e.g., in the time period T1, the voltage of the selected word line WLn is raised to Vpgm1, while the word lines WLn−1 and WLn+1 adjacent to the selected word line WLn are kept at a voltage Vss. The memory cells on the word lines WLn−1 and WLn+1 adjacent to the selected word line WLn are prevented from being misprogrammed during the program process. By keeping the unselected word lines at the reference voltage Vss, the electrical interference to the adjacent memory cells may be reduced during the program process, the accuracy and stability of program operation may be improved, and a data error code and voltage crosstalk may be prevented.

S30: applying a second program voltage to the first type of selected word lines and a pass voltage to unselected word lines adjacent to the first type of selected word lines during a second time period of the first program stage.

The memory cells coupled to the unselected word lines adjacent to the first type of selected word lines are in an erased state, and the second program voltage is greater than the first program voltage. During the second time period of the first program stage, the main object is to synchronize with the voltage raising process of the adjacent unselected word lines by the process of gradually raising the first type of selected word lines from the first program voltage to the second program voltage, thereby optimizing the entire program operation. Specifically, when the first type of selected word lines undergoes the voltage raising, the adjacent unselected word lines also begin to undergo a voltage variation. This strategy of synchronously raising the voltages of the selected word lines and the unselected word lines at the same time node can shorten the program time of the memory cells coupled to the first type of selected word lines, thereby ensuring program operation to be more efficient and reliable.

As an example, with continued reference to FIG. 14, during the second time period of the first program stage, e.g., a time period T2, the voltage of the selected word line WLn continues to raise from Vpgm1 to Vpgm2, while the voltages of the word lines WLn−1 and WLn+1 adjacent to the selected word line WLn begin to raise from Vss to Vpass during the second stage. The process of raising the voltages of the adjacent unselected word lines will make the voltage of the selected word line WLn raise faster, and the time required to raise from Vpgm1 to Vpgm2 is also shorter, such that the entire time period T2 is shorter as well.

The second type of selected word lines will be described below. In a feasible implementation, the second type of selected word lines are applied with the first program voltage during a first time period of a second program stage. The second type of selected word lines are applied with the second program voltage which is greater than the first program voltage during a second time period of the second program stage. The unselected word lines adjacent to the second type of selected word lines are continuously applied with a pass voltage during the first time period of the second program stage and the second time period of the second program stage.

Because the memory cells coupled to the unselected word lines adjacent to the second type of selected word lines are in the programmed state, there is no coupling effect between the second type of selected word lines and the adjacent word lines. During the first time period of the second program stage, the main object is to raise the second type of selected word lines to the first program voltage and enable the entire program operation to be carried out smoothly. A higher program voltage can ensure that the memory cells reach a required charge state or threshold voltage, such that the data is stored accurately, and the pass voltage is set at an appropriate value which is enough to keep the memory cells on the adjacent unselected word lines in the state of not being programmed or erased. This can prevent adjacent memory cells from being interfered or misprogrammed due to the high program voltage of the selected word line.

Figure 15:
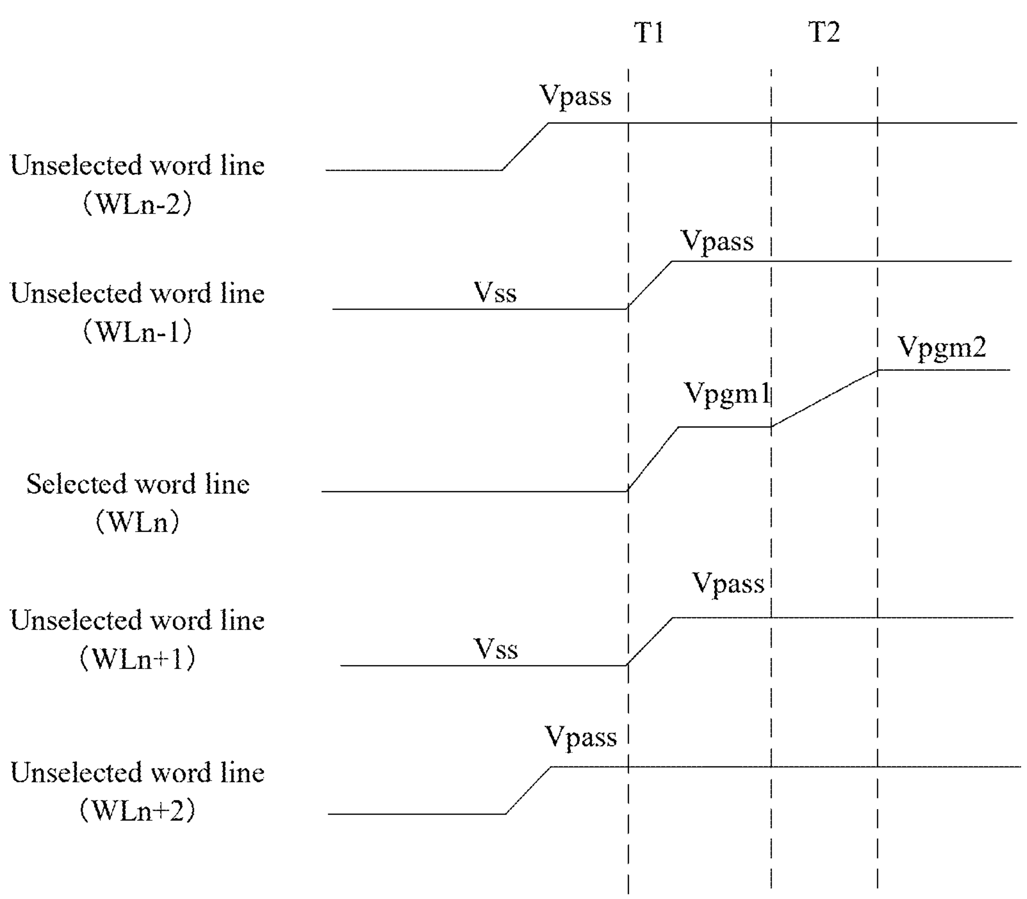
FIG. 15 is a schematic diagram of another program timing provided by examples of the present disclosure.

As an example, referring to FIG. 15, during the first time period of the second program stage, e.g., the time period T1, the voltage of the selected word line WLn is raised to Vpgm1, while the word lines WLn−1 and WLn+1 adjacent to the selected word line WLn begin to raise from Vss to Vpass. During the second time period of the second program stage, e.g., the time period T2, the voltage of the selected word line WLn continues to raise from Vpgm1 to Vpgm2, while the voltages of the word lines WLn−1 and WLn+1 adjacent to the selected word line WLn are kept at Vpass.

Before the program operation of the first type of selected word lines or the second type of selected word lines, the operation process may be the same when the unselected word lines that are not adjacent to the selected word lines are operated. In a feasible implementation, before determining the type of the selected word line coupled to the target memory cell, the method further comprises: applying the pass voltage to unselected word lines that are not adjacent to the selected word line.

Referring to FIG. 14 or 15, when the unselected word lines WLn−2 and WLn+2 that are not adjacent to the selected word line WLn are operated, the voltages of the unselected word lines WLn−2 and WLn+2 are raised to Vpass before the time period T1, and are kept at Vpass during the time period T1 and the time period T2.

The programming method of the memory provided by the present disclosure significantly reduces the time required for voltage raising by adjusting the voltage raising time nodes of the unselected word lines adjacent to the first type of selected word lines (the word lines in which the memory cells coupled to the adjacent unselected word lines are in an erased state). This method makes the voltage raise faster, thereby shortening the overall program time. Furthermore, the rapid voltage raising reduces the electrical stress on the memory cells, further prolongs the service life of the memory, and enhances the overall performance and reliability of the memory.

Examples of the present disclosure further provide a memory comprising a memory cell array and a peripheral circuit coupled to the memory cell array, wherein the peripheral circuit is configured to: apply a first program voltage to a first type of selected word lines and a reference voltage to unselected word lines adjacent to the first type of selected word lines during a first time period of a first program stage; and apply a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage.

In some examples, the peripheral circuit is further configured to: apply the first program voltage to a second type of selected word lines during a first time period of a second program stage; apply the second program voltage which is greater than the first program voltage to the second type of selected word lines during a second time period of the second program stage; and continuously apply the pass voltage to unselected word lines adjacent to the second type of selected word lines during the second program stage.

In some examples, memory cells coupled to the unselected word lines adjacent to the second type of selected word lines are in a programmed state.

In some examples, the peripheral circuit is further configured to: determine a type of a selected word line coupled to a target memory cell, and perform a corresponding program strategy according to the type of the selected word line.

In some examples, the peripheral circuit is configured to: acquire a word line address of the selected word line, and determine the type of the selected word line coupled to the target memory cell according to a matching result between the word line address and a preset grouping relationship table.

In some examples, the peripheral circuit is further configured to: apply the pass voltage to unselected word lines that are not adjacent to the selected word line.

Examples of the present disclosure further provide a memory system, which may be, for example, the memory system shown in FIG. 2 in the aforementioned examples. The memory system comprises a memory 112 and a memory controller 111 provided in the aforementioned examples. The memory controller 111 is coupled to the memory 112 via a flash interface circuit to control the memory 112 to store data.

Examples of the present disclosure further provide an electronic apparatus, which may be, for example, the electronic apparatus shown in FIG. 1 in the aforementioned examples. The electronic apparatus comprises a host 100 and a memory system 110 provided in several aforementioned examples. The host 100 is connected with the memory system 110 to write data to the memory system 110 or read data stored in the memory system 110.

Those skilled in the art can clearly appreciate that, for case and simplicity of description, in the above examples, the descriptions of various examples have their own emphases, and the portions of some example that are not described in detail may be referred to a corresponding process in the aforementioned method examples, which is no longer repeated herein.

In several examples provided by the present disclosure, it should be understood that the provided programming method and memory may be implemented by other manners. For example, the division of some module is only a logical functional division. In a real implementation, there may be another manner for division. For example, a plurality of units or assemblies may be combined, or may be integrated into another system, or some features may be omitted or not performed.

Examples of the present disclosure provide a programming method of a memory, a memory, and a memory system. The examples of the present disclosure employ the following technical solutions:

In a first aspect, there is provided a programming method of a memory. The method comprises: applying a first program voltage to a first type of selected word lines and a reference voltage to unselected word lines adjacent to the first type of selected word lines during a first time period of a first program stage; and applying a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage.

In some examples, the method further comprises: applying the first program voltage to a second type of selected word lines during a first time period of a second program stage; applying the second program voltage which is greater than the first program voltage to the second type of selected word lines during a second time period of the second program stage; and continuously applying the pass voltage to unselected word lines adjacent to the second type of selected word lines during the second program stage.

In some examples, memory cells coupled to the unselected word lines adjacent to the second type of selected word lines are in a programmed state.

In some examples, before the first program stage or the second program stage, the method further comprises: determining a type of a selected word line coupled to a target memory cell, and performing a corresponding program strategy according to the type of the selected word line.

In some examples, determining the type of the selected word line coupled to the target memory cell comprises: acquiring a word line address of the selected word line, and determining the type of the selected word line coupled to the target memory cell according to a matching result between the word line address and a preset grouping relationship table.

In some examples, before determining the type of the selected word line coupled to the target memory cell, the method further comprises: applying the pass voltage to unselected word lines that are not adjacent to the selected word line.

In a second aspect, there is provided a memory comprising: a memory cell array and a peripheral circuit coupled to the memory cell array, wherein the peripheral circuit is configured to: apply a first program voltage to a first type of selected word lines and a reference voltage to unselected word lines adjacent to the first type of selected word lines during a first time period of a first program stage; and apply a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage.

In some examples, the peripheral circuit is further configured to: apply the first program voltage to a second type of selected word lines during a first time period of a second program stage; apply the second program voltage which is greater than the first program voltage to the second type of selected word lines during a second time period of the second program stage; and continuously apply the pass voltage to unselected word lines adjacent to the second type of selected word lines during the second program stage.

In some examples, memory cells coupled to the unselected word lines adjacent to the second type of selected word lines are in a programmed state.

In some examples, the peripheral circuit is further configured to: determine a type of a selected word line coupled to a target memory cell, and perform a corresponding program strategy according to the type of the selected word line.

In some examples, the peripheral circuit is configured to: acquire a word line address of the selected word line, and determine the type of the selected word line coupled to the target memory cell according to a matching result between the word line address and a preset grouping relationship table.

In some examples, the peripheral circuit is further configured to: apply the pass voltage to unselected word lines that are not adjacent to the selected word line.

In a third aspect, the present disclosure provides a memory system comprising a memory controller and a memory, wherein the memory controller is coupled to the memory through a flash interface circuit, and the memory controller is configured to control the memory to write data or read data stored in the memory.

In a fourth aspect, the present disclosure provides a computer readable storage medium which stores a computer executable instruction that, upon being executed, can implement the method of any example of the first aspect.

In a fifth aspect, the present disclosure provides an electronic apparatus comprising a processor and a readable storage medium coupled with the processor, wherein the readable storage medium stores an executable instruction that, when executed by the processor, can implement the method of any example of the first aspect.

Those of ordinary skill in the art can recognize that the modules and algorithm steps of various examples as described in conjunction with the examples disclosed herein can be implemented in an electronic hardware, or a combination of a computer software and an electronic hardware. Whether these functions are performed by means of a hardware or a software depends on particular applications and design constraints of the technical solution. Professional technicians can implement the described function using different methods for each particular application, but such implementation should not be considered to be beyond the scope of the present disclosure.

The above descriptions are merely specific implementations of the present disclosure, and the protection scope of the present disclosure is not limited to these. Any variation or replacement that may be readily figured out by those skilled in the art within the technical scope disclosed by the present disclosure shall fall within the protection scope of the present disclosure. Therefore, the protection scope of the present disclosure shall be defined by the protection scope of the claims.

What is claimed is:

1. A method of programming a memory, comprising:

applying a first program voltage to a first type of selected word lines and a reference voltage to unselected word lines adjacent to the first type of selected word lines during a first time period of a first program stage; and applying a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage.

2. The method of claim 1, further comprising:

applying the first program voltage to a second type of selected word lines during a first time period of a second program stage;

applying the second program voltage which is greater than the first program voltage to the second type of selected word lines during a second time period of the second program stage; and continuously applying the pass voltage to unselected word lines adjacent to the second type of selected word lines during the first time period and the second time period of the second program stage.

3. The method of claim 2, wherein memory cells coupled to the unselected word lines adjacent to the second type of selected word lines are in a programmed state.

4. The method of claim 2, wherein before the first program stage or the second program stage, the method further comprises:

determining a type of a selected word line coupled to a target memory cell, and performing a corresponding program strategy according to the type of the selected word line.

5. The method of claim 4, wherein determining the type of the selected word line coupled to the target memory cell comprises:

acquiring a word line address of the selected word line, and determining the type of the selected word line coupled to the target memory cell according to a matching result between the word line address and a preset grouping relationship table.

6. The method of claim 4, wherein before the determining the type of the selected word line coupled to the target memory cell, the method further comprises:

applying the pass voltage to unselected word lines that are not adjacent to the selected word line.

7. A memory, comprising:

a memory cell array; and a peripheral circuit coupled to the memory cell array, wherein the peripheral circuit is configured to:

apply a first program voltage to a first type of selected word lines and a reference voltage to unselected word lines adjacent to the first type of selected word lines during a first time period of a first program stage; and apply a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage.

8. The memory of claim 7, wherein the peripheral circuit is further configured to:

apply the first program voltage to a second type of selected word lines during a first time period of a second program stage;

apply the second program voltage which is greater than the first program voltage to the second type of selected word lines during a second time period of the second program stage; and continuously apply the pass voltage to unselected word lines adjacent to the second type of selected word lines during the first time period and the second time period of the second program stage.

9. The memory of claim 8, wherein memory cells coupled to the unselected word lines adjacent to the second type of selected word lines are in a programmed state.

10. The memory of claim 7, wherein the peripheral circuit is further configured to:

determine a type of a selected word line coupled to a target memory cell, and perform a corresponding program strategy according to the type of the selected word line.

11. The memory of claim 10, wherein the peripheral circuit is configured to:

acquire a word line address of the selected word line, and determine the type of the selected word line coupled to the target memory cell according to a matching result between the word line address and a preset grouping relationship table.

12. The memory of claim 10, wherein the peripheral circuit is further configured to: apply the pass voltage to unselected word lines that are not adjacent to the selected word line.

13. A memory system, comprising:

a memory controller; and a memory, wherein the memory includes:

a memory cell array and a peripheral circuit coupled to the memory cell array, wherein the peripheral circuit is configured to:

apply a first program voltage to a first type of selected word lines and a reference voltage to unselected word lines adjacent to the first type of selected word lines during a first time period of a first program stage; and apply a second program voltage to the first type of selected word lines and a pass voltage to the unselected word lines adjacent to the first type of selected word lines during a second time period of the first program stage, wherein memory cells coupled to the unselected word lines adjacent to the first type of selected word lines are in an erased state, and the second program voltage is greater than the first program voltage, wherein the memory controller is configured to control the memory to write data or read data stored in the memory.

14. The memory of claim 13, wherein the peripheral circuit is further configured to:

apply the first program voltage to a second type of selected word lines during a first time period of a second program stage;

apply the second program voltage which is greater than the first program voltage to the second type of selected word lines during a second time period of the second program stage; and continuously apply the pass voltage to unselected word lines adjacent to the second type of selected word lines during the first time period and the second time period of the second program stage.

15. The memory of claim 14, wherein memory cells coupled to the unselected word lines adjacent to the second type of selected word lines are in a programmed state.

16. The memory of claim 13, wherein the peripheral circuit is further configured to:

determine a type of a selected word line coupled to a target memory cell, and perform a corresponding program strategy according to the type of the selected word line.

17. The memory of claim 16, wherein the peripheral circuit is configured to:

acquire a word line address of the selected word line, and determine the type of the selected word line coupled to the target memory cell according to a matching result between the word line address and a preset grouping relationship table.

18. The memory of claim 16, wherein the peripheral circuit is further configured to: apply the pass voltage to unselected word lines that are not adjacent to the selected word line.

* * * * *